(12) United States Patent
Calvignac et al.

(10) Patent No.: US 7,167,471 B2
(45) Date of Patent: Jan. 23, 2007

(54) NETWORK PROCESSOR WITH SINGLE INTERFACE SUPPORTING TREE SEARCH ENGINE AND CAM

(75) Inventors: Jean Louis Calvignac, Cary, NC (US); Gordon Taylor Davis, Chapel Hill, NC (US); Marco Heddes, Cary, NC (US); Michael Steven Siegel, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 920 days.

(21) Appl. No.: 09/940,758

(22) Filed: Aug. 28, 2001

(65) Prior Publication Data

US 2003/0048785 A1    Mar. 13, 2003

(51) Int. Cl.
*H04L 12/56* (2006.01)
(52) U.S. Cl. .................. 370/389; 370/392; 370/401
(58) Field of Classification Search ............... 370/389, 370/392, 401–404
See application file for complete search history.

(56) References Cited

U.S. PATENT DOCUMENTS

| 5,408,434 | A | | 4/1995 | Stansfield | 365/189.08 |
|---|---|---|---|---|---|
| 5,414,704 | A | * | 5/1995 | Spinney | 370/389 |
| 5,448,733 | A | | 9/1995 | Satoh et al. | 395/600 |
| 5,519,649 | A | | 5/1996 | Takahashi | 364/736.5 |
| 5,898,689 | A | * | 4/1999 | Kumar et al. | 370/232 |
| 5,940,852 | A | | 8/1999 | Rangasayee et al. | 711/108 |
| 6,052,683 | A | | 4/2000 | Irwin | 707/8 |
| 6,114,873 | A | | 9/2000 | Sahraoui et al. | 326/39 |
| 6,209,020 | B1 | * | 3/2001 | Angle et al. | 718/108 |
| 6,343,289 | B1 | * | 1/2002 | Hunter et al. | 707/10 |
| 6,453,358 | B1 | * | 9/2002 | Michels et al. | 709/238 |
| 6,529,897 | B1 | * | 3/2003 | Corl et al. | 707/2 |
| 6,606,681 | B1 | * | 8/2003 | Uzun | 711/108 |
| 6,687,807 | B1 | * | 2/2004 | Damron | 712/205 |
| 6,771,646 | B1 | * | 8/2004 | Sarkissian et al. | 370/392 |
| 6,788,683 | B1 | * | 9/2004 | Ikeda et al. | 370/389 |
| 6,862,281 | B1 | * | 3/2005 | Chandrasekaran | 370/392 |
| 2001/0028651 | A1 | * | 10/2001 | Murase | 370/392 |
| 2002/0038379 | A1 | * | 3/2002 | Sato etal. | 709/238 |
| 2002/0126672 | A1 | * | 9/2002 | Chow et al. | 370/392 |
| 2002/0154634 | A1 | * | 10/2002 | Basso et al. | 370/390 |

* cited by examiner

*Primary Examiner*—Ricky Q. Ngo
*Assistant Examiner*—Nguyen Ngo
(74) *Attorney, Agent, or Firm*—Robert A. Voigt, Jr.; Winstead, Sechrest & Minick P.C.

(57) ABSTRACT

A method and system for identifying a data structure associated with a packet of data. A processor internal to a packet processor may extract one or more fields in a packet header field of a received packet of data to generate a search key. The internal processor may then be configured to select which table, e.g., routing table, quality of service table, filter table, needs to be accessed using the search key in order to process the received packet of data. A determination may then be made by the internal processor as to whether a CAM or a hash table and a Patricia Tree are used to identify the data structure associated with the received packet of data. Based on table definitions in a register, the internal processor may make such a determination.

37 Claims, 5 Drawing Sheets

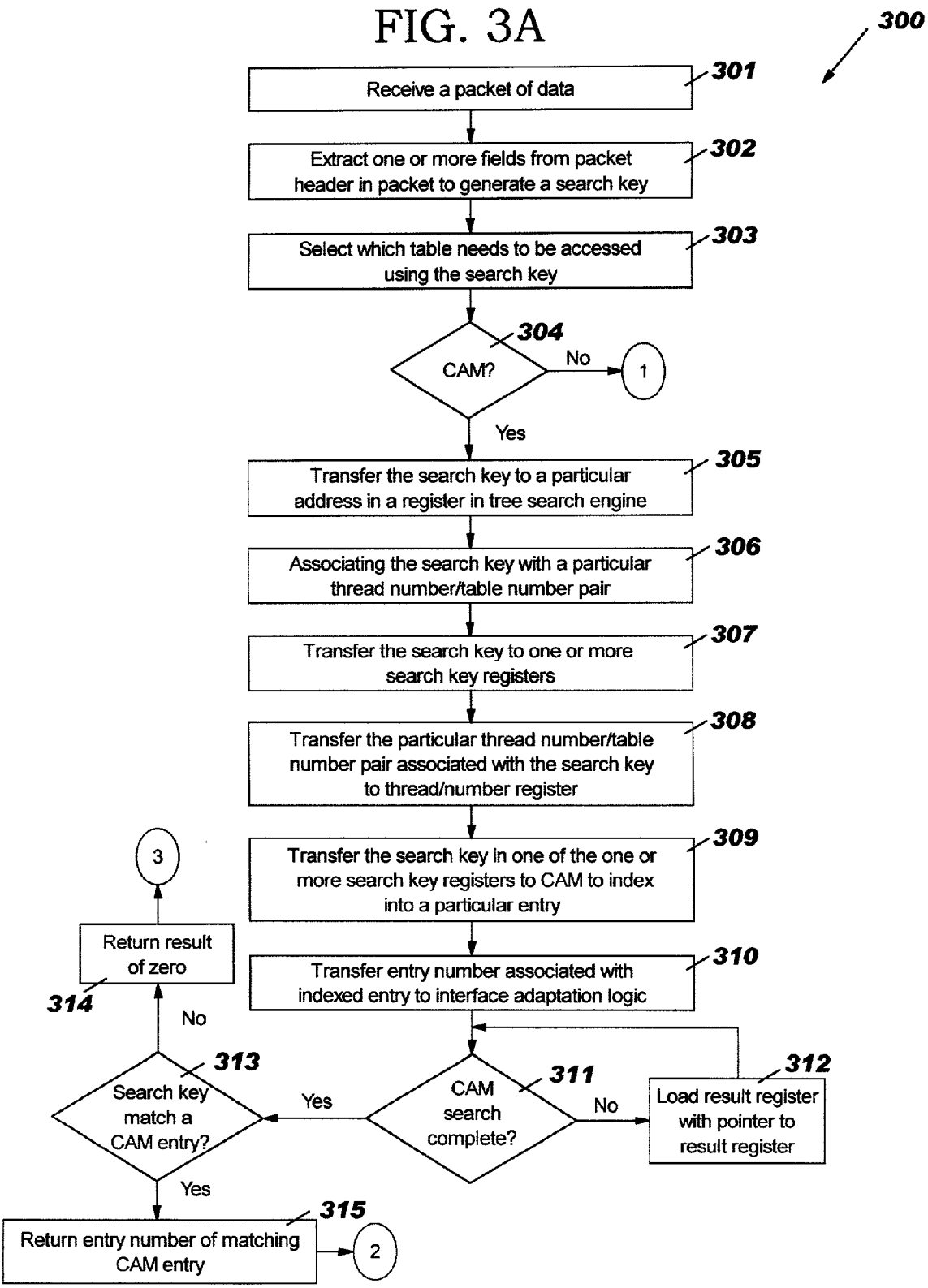

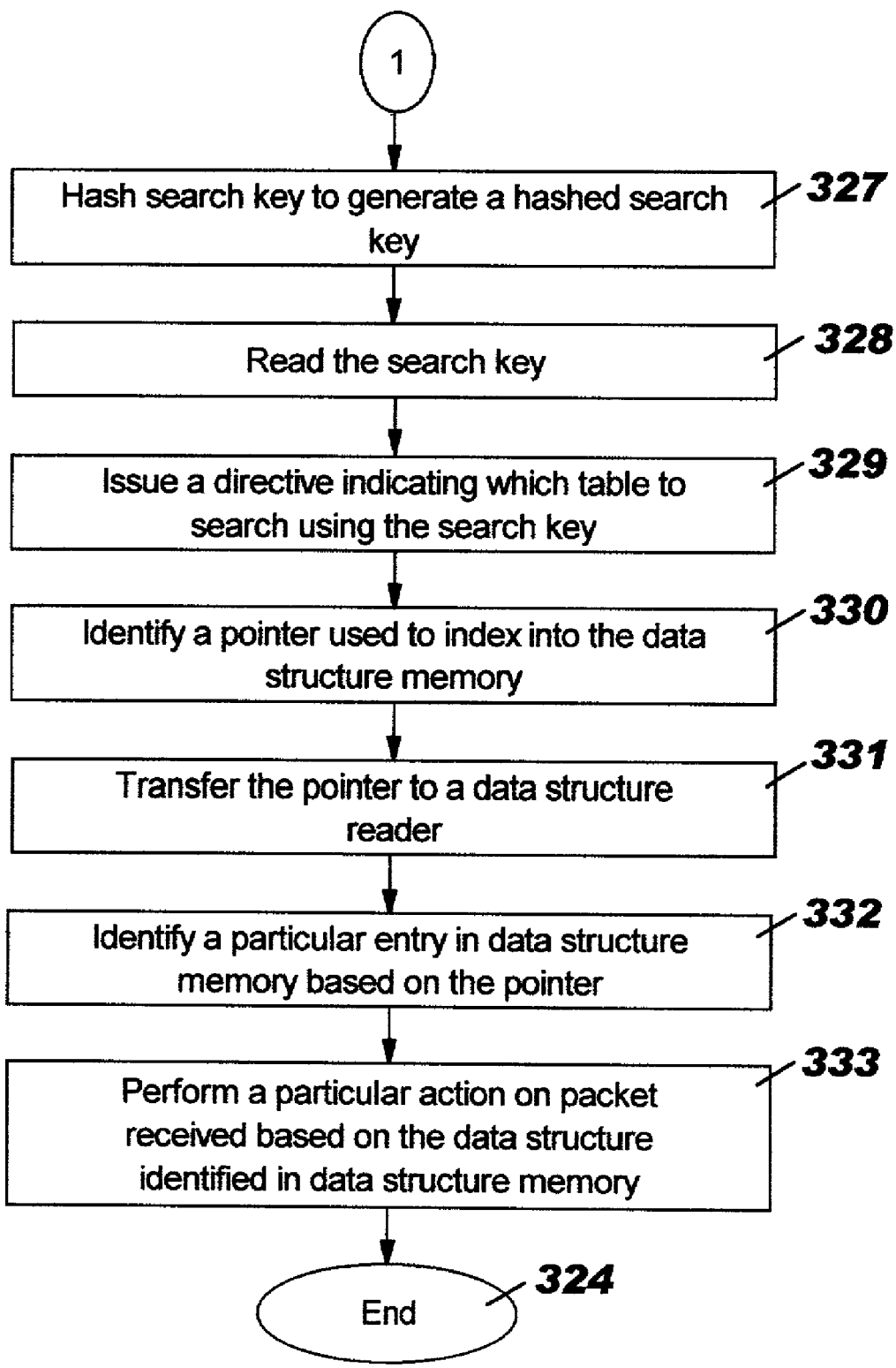

NETWORK PROCESSOR WITH SINGLE INTERFACE SUPPORTING TREE SEARCH ENGINE AND CAM

TECHNICAL FIELD

The present invention relates to the field of a packet switching network system, and more particularly to a packet processor with the capability of procuring the data structure associated with a received packet of data using either a tree, e.g., Practical Algorithm To Retrieve Information Coded in Alphanumeric (Patricia) tree, or a Content Addressable Memory (CAM).

BACKGROUND INFORMATION

A packet switching network has switching points or nodes for transmissions of data among senders and receivers connected to the network. The switching performed by these switching points is in fact the action of passing on packets of data received by a switching point or node to a further node in the network. Such switching actions are the means by which communication data is moved through the packet switching network.

Each node may comprise a packet processor configured to process packets of data. When a packet processor receives a particular packet of data, the packet processor may produce what is commonly referred to as a search key. The search key may be hashed into an alternate form commonly referred to as a hashed search key. The search key may be used to determine what actions to perform on the packet as described in further detail below. Typically, a search key may be generated by the packet processor by extracting particular information in the packet header, e.g., source and destination address, source and destination port. Once the search key is generated, a tree search engine within the packet processor may access an entry in a table commonly referred to as a hash table using the search key. The hash table may comprise a plurality of entries that enables the tree search engine to access a particular entry in a data structure associated with the particular packet processor. The data structure may comprise data as to what actions, e.g., modifying packet, which port of packet processor to forward packet, the packet processor should perform on the packet.

As stated above, the search key may be used to access an entry in a data structure by a tree search engine. The particular entry in the data structure may be accessed by accessing a particular entry in the hash table. Since a search key may be hundreds of bits long, the tree search engine may use only certain bits to determine which entry to access in the hash table. Consequently, one or more entries may be accessed in the hash table by the same search key thereby causing a conflict. These conflicts may be resolved by what is commonly referred to as a Practical Algorithm To Retrieve Information Coded in Alphanumeric (Patricia) Tree. A Patricia Tree structure may typically be stored in a memory, e.g., Static Random Access Memory (SRAM), external to the tree search engine. A Patricia Tree may test appropriate bits in the search key to distinguish one entry in the direct table from another. Details regarding testing appropriate bits are discussed in "Patricia—Practical Algorithm to Retrieve Information Coded in Alphanumeric", Journal of the ACM, Vol. 15, 1968.

A search key may also be used to access a particular entry in a data structure using a Content Addressable Memory (CAM) instead of using a Patricia Tree structure and hash table. It is noted that the search key need not be hashed when a CAM is used to access a particular entry in a data structure. A CAM may refer to a memory that is accessed by comparing the content of the data stored rather than by addressing predetermined locations. A CAM may comprise entries where each of those entries may store a particular pointer to a data structure entry associated with a particular search key. By storing a particular pointer equivalent to a data structure entry, conflicts, i.e., collisions, may be avoided. Subsequently, an advantage of implementing a CAM versus a Patricia Tree structure to search for a particular entry in the data structure is that the search may be conducted faster since there may be no collisions. However, a CAM is more expensive than implementing the low cost memory that stores the Patricia Tree structure used by the tree search engine.

It would therefore be desirable to develop a system that allows some searches to be accomplished by the tree search engine using a lower cost memory and other searches accomplished using the higher cost but faster CAM.

SUMMARY

The problems outlined above may at least in part be solved in some embodiments by storing table definitions in a register where these table definitions may comprise information as to whether a Content Addressable Memory (CAM) or a hash table and a Practical Algorithm To Retrieve Information Coded in Alphanumeric (Patricia) Tree are used to identify a particular entry in a data structure associated with a received packet of data.

In one embodiment of the present invention, a method for identifying a data structure associated with a packet of data may comprise the step of receiving a packet of data by a packet processor. A processor internal to the packet processor may be configured to extract one or more fields in the packet header field of the received packet of data to generate a search key. The internal processor may then be configured to select which table, e.g., routing table, quality of service table, filter table, needs to be accessed using the search key in order to process the received packet of data. A determination may then be made by the internal processor as to whether a CAM or a hash table and a Patricia Tree are used to identify the data structure associated with the received packet of data.

In one embodiment, a register in a tree search engine coupled to the internal processor within the packet processor may be configured to store table definitions. These table definitions may comprise information as to whether a CAM or a hash table and a Patricia Tree are used to identify a particular entry in a data structure associated with a received packet of data. Hence, the internal processor may determine whether a CAM or a hash table and a Patricia Tree are used to identify a particular entry in a data structure associated with a received packet of data based on reading this register.

If the table definition associated with the table selected by the internal processor indicates to identify a particular entry in a data structure associated with a received packet of data using a CAM then a search may be conducted in the CAM for a matching entry with the search key generated by the internal processor. The CAM may comprise a plurality of entries where each entry has a particular entry number associated with it. If the search key matches a particular entry in the CAM, then the CAM may return the entry number of the matching entry. The entry number of the matching entry may be used to index into a particular entry in a data structure memory to identify the data structure associated with the received packet of data. Upon identifying the data structure associated with the received packet of data, the internal processor may be configured to perform particular actions, e.g., modify packet, on the received packet of data.

If the table definition associated with the table selected by the internal processor indicates to identify a particular entry in a data structure associated with a received packet of data using a hash table and a Patricia Tree then the search key may be hashed into a hashed search key. The hashed search key may be used to index into a hash table. Since one or more entries may be accessed in the hash table by the same hashed search key thereby causing a conflict, a Patricia Tree may be used to resolve the conflicts. Upon testing each of the appropriate bits in the hashed search key, the Patricia Tree structure may point to a pointer that may be used to index into the appropriate entry in the data structure memory to identify the data structure associated with the received packet of data. Upon identifying the data structure associated with the received packet of data, the internal processor may be configured to perform particular actions, e.g., modify packet, on the received packet of data.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which:

FIGS. 3A–C are a flowchart of a method for identifying a data structure associated with a received packet of data.

DETAILED DESCRIPTION

Figure 1:
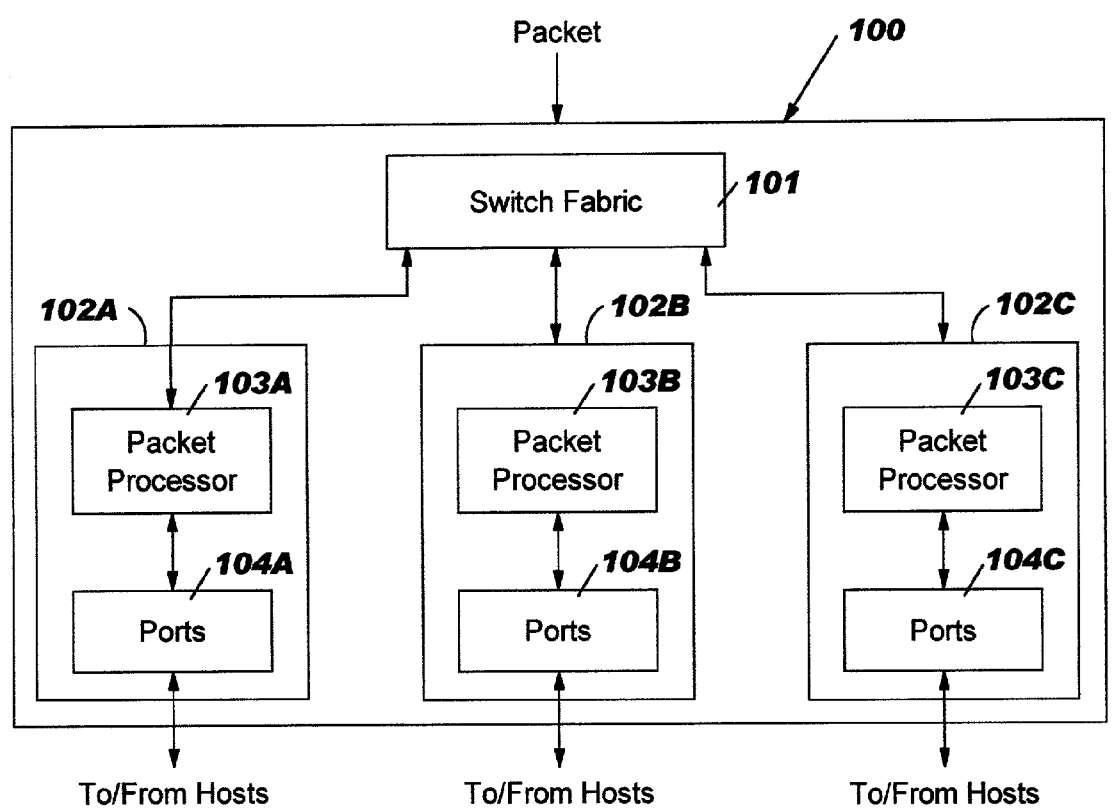
FIG. 1 illustrates an embodiment of a switch in a packet switching network configured in accordance with the present invention.

FIG. 1—Switch in a Packet Switching Network

FIG. 1 illustrates an embodiment of a switch 100 in a packet switching network. Switch 100 may be configured to receive packets of data that may be directed to another particular switch 100 in the packet switching network. Switch 100 may comprise a switch fabric 101 configured to direct the incoming packets of data to particular blades 102A–C coupled to switch fabric 101. Blade 102A may comprise a packet processor 103A coupled with ports 104A. Blades 102B and 102C are configured similarly to blade 102A. Blades 102A–C may collectively or individually be referred to as blades 102 or blade 102, respectively. Packet processors 103A–C may collectively or individually be referred to as packet processors 103 or packet processor 103, respectively. Ports 104 may collectively or individually be referred to as ports 104 or port 104, respectively. Each port 104 may be coupled with hosts (not shown) or other switches 100. Blades 102 may provide traffic to switch fabric 101 and accept traffic from switch fabric 101. Thus, any host connected with one of blades 102 may communicate with another host connected to another blade 102. It is noted that switch 100 may comprise any number of blades 102 and each blade 102 may comprise any number of packet processors 103 and ports 104 and that FIG. 1 is illustrative.

Figure 2:
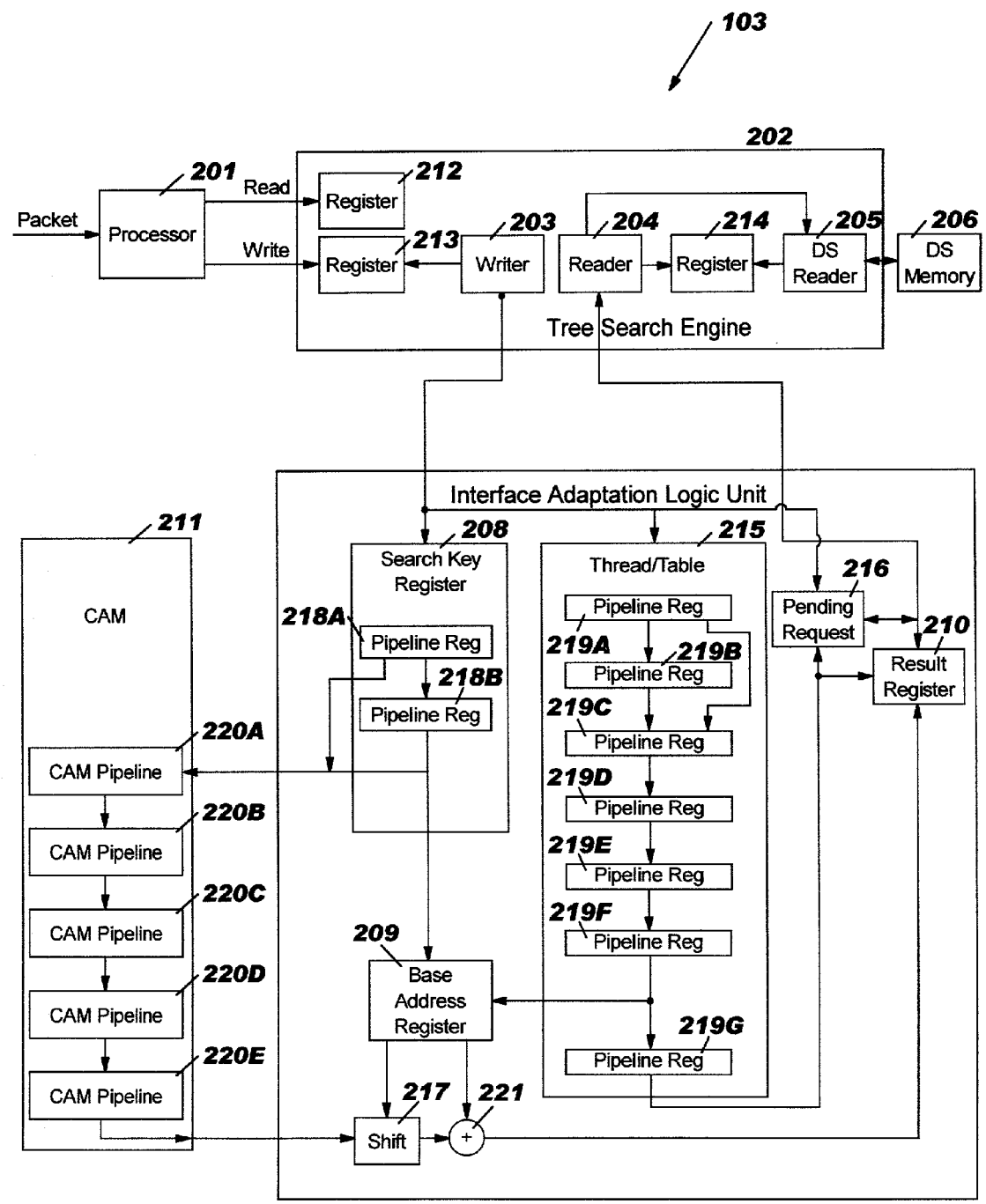
FIG. 2 illustrates an embodiment of the present invention of a packet processor.

FIG. 2—Packet Processor

FIG. 2 illustrates an embodiment of the present invention of a packet processor 103 in a packet switching network. Packet processor 103 may be configured to receive packets, i.e., frames, of data from switch fabric 101 (FIG. 1) and transmit the packets, i.e., frames, of data to another switch 100 in the packet switching network. Packet processor 103 may comprise an internal processor 201 configured to receive a packet of data from switch fabric 101 (FIG. 1) and extract one or more fields, e.g., source and destination address, source and destination port, protocol, from the packet header in the packet to generate a search key. Internal processor 201 may then be configured to hash the key into a search key used to index an entry into a table, e.g., hash table, when a Patricia tree is used to access a particular entry in a data structure memory 206. A description of a hash algorithm used to hash the search key into a hashed search key is described in U.S. patent application Ser. No. 09/210,222, filed on Dec. 10, 1998, entitled "Hash Function in IP, MAC, and Other Structured Addresses," which is hereby incorporated herein in its entirety by reference.

The search key may be used to determine the data structure associated with the received packet stored in data structure memory 206. Data structure memory 206 may comprise a plurality of data structures where each data structure may comprise specific actions, e.g., modify packet, port of blade 102 to forward packet, that processor 201 should perform on the received packet. Packet processor 103 may further comprise a tree search engine 202, a Content Addressable Memory (CAM) 211 and an interface adaptation logic unit 207 interfacing tree search engine 202 and CAM 211. Tree search engine 202 may be configured to search a particular table, e.g., hash table, storing pointers which point to particular data structures in data structure memory 206 using a tree, e.g., Patricia Tree. CAM 211 may be configured to search a particular table by selecting an entry out of the plurality of entries based on the search key where the contents of each entry may be used to determine the data structure associated with the received packet stored in a data structure memory 206. Interface adaptation logic unit 207 may be embodied as an Application Specific Integrated Circuit (ASIC) or as a Field Programmable Gate Array (FPGA). A more detailed description of tree search engine 202, CAM 211 and interface adaptation logic 207 is provided below. Processor 201 may be configured to determine the data structure associated with the received packet using either a Patricia Tree structure stored in a lower cost memory or using the higher cost but faster CAM 211 as described in greater detail below and in the description of FIGS. 3A–C.

As stated above, processor 201 may be configured to generate a search key by extracting one or more fields from the packet header in the received packet. Processor 201 may further be configured to determine which table, e.g., routing table, quality of service table, filter table, needs to be accessed using the search key in order to process the received packet of data. That is, the tree search engine 202 may be used to access an entry in a variety of tables such as a routing table, quality of service table, filter table, etc., to process the received packet of data. Furthermore, processor 201 may be configured to determine whether CAM 211 is required to identify the data structure in data structure memory 206 associated with the received packet as described further below as well as in the description of FIGS. 3A–C.

Tree search engine 202 may be configured to access an entry in data structure memory 206 using the search key generated by processor 201. Tree search engine 202 may comprise a reader 204 configured to read the search key temporarily stored in memory (not shown) in processor 201. Reader 204 may further be configured to temporarily store the search key read in a register 213. Reader 204 may further be configured to use the search key to identify a pointer used to access a particular entry in the data structure in data structure memory 206. When the search key is hashed to access an entry into a hash table, the hashed search key may access more than one entry in the hash table thereby causing a conflict. These conflicts may be resolved by a Practical Algorithm To Retrieve Information Coded in Alphanumeric (Patricia) Tree. A Patricia Tree may test appropriate bits in the search key not used to index into the hash table to distinguish one entry from another that share a common location in the hash table. Upon testing each of the appropriate bits in the search key, the Patricia Tree structure points to a pointer that may be used to index into the appropriate entry in data structure memory 206. It is noted that the Patricia Tree structure (not shown) may reside in a memory, e.g., SRAM, external to tree search engine 202 connected through interface adaptation logic unit 207.

Once reader 204 identifies the pointer using the Patricia Tree structure (not shown), reader 204 may transfer the pointer to a data structure reader 205. Data structure reader 205 may be configured to identify a particular entry in data structure memory 206 using the pointer received from reader 204. Upon data structure reader 205 reading the data structure associated with the received packet of data, processor 201 may be configured to perform particular actions, e.g., modify packet, on the received packet of data.

As stated above, processor 201 may be configured to determine the data structure associated with the received packet using tree search engine 202 to access CAM 211 instead of the Patricia Tree structure described previously. The procedure used to access CAM 211 is described in greater detail in the description of FIG. 3. In one embodiment, processor 201 may be configured to read a register 212 in tree search engine 202 to determine whether CAM 211 is required to identify the data structure in data structure memory 206 associated with the received packet of data. Register 212 may be configured to store definitions associated with various tables, e.g., routing table, quality of service table, filter table. A table definition may comprise information as to whether a CAM 211 may be required to search the table to identify the data structure in data structure memory 206 associated with the received packet. Each particular table in packet processor 103 may comprise a table definition stored in register 212. If the table definition indicates to search the table using CAM 211, then processor 201 may be configured to transfer the search key to register 213 of tree search engine 202. Processor 201 in addition to transferring the search key may transfer a directive to tree search engine 202 to search the table selected by processor 201 using CAM 211.

Furthermore, if the table definition indicates to search the table using CAM 211, a writer 203 of tree search engine 202 may be configured to transfer the search key temporarily residing in register 213 to one or more search key registers 208 in interface adaptation logic unit 207. Furthermore, writer 203 of tree search engine 202 may further be configured to transfer the address of the search key to a thread/table register 215 where the address decodes a particular thread number/table number pair. A thread number may refer to a particular task, e.g., processing a particular packet of data, of processor 201. Multiple processors may be assigned different thread numbers to insure results are returned to the requesting processor. A table number may refer to a particular table, e.g., routing table, filter table, quality of service table, in packet processor 103 used to process a packet of data.

As stated above, writer 203 of tree search engine may be configured to transfer the search key temporarily residing in register 213 to one or more search key registers 208 in interface adaptation logic unit 207. Each search key register 208 may comprise one or more registers, e.g., pipeline registers 218A–B, organized in a pipeline manner thereby enabling a search key to be assigned to one or more tables based on a single thread number/table number pair. An extra table number may be defined to associate a search key with multiple tables, individually defined by other numbers. Subsequently, a search key may be used to index into two or more different tables, e.g., thereby improving the utilization of the bandwidth. For example, a search key may be stored in pipeline register 218A and assigned a particular table number. In the next clock cycle, the search key in pipeline register 218A may be transferred to CAM 211 as well as transferring a duplicate of the same search key to pipeline register 218B. The search key temporarily stored in pipeline register 218B may then be assigned another particular table number. Thus, a search key may be assigned to one or more table numbers for a specific thread search action. The search key temporarily stored in pipeline register 218B may be transferred to CAM 211 in the next clock cycle. Pipeline registers 218A–B may collectively or individually be referred to as pipeline registers 218 or pipeline register 218, respectively. It is noted that each search key register 208 may comprise any number of pipeline registers 218 and that a search key may be assigned any number of table numbers.

Each particular thread number/task number pair associated with a particular search key stays associated with the appropriate search key by thread/table register 215 comprising one or more pipeline registers 219A–G, i.e., being organized in a pipeline manner. Referring to the above example, when the search key temporarily stored in pipeline register 218A is transferred to CAM 211, the particular thread number/table number associated with that search key is transferred to pipeline register 219C. When the duplicate of the search key is transferred to pipeline register 218B, a new particular thread number/table number pair is assigned to the search key temporarily stored in pipeline register 218B. That new particular thread number/table number pair may be temporarily stored in pipeline register 219B. Subsequently, one or more particular thread number/table number pairs may be associated with the same search key. Pipeline registers 219A–G may collectively or individually be referred to as pipeline registers 219 or pipeline register 219, respectively. It is noted that thread/table register 215 may comprise any number of pipeline registers 219 and that a search key may be assigned any number of table numbers. It is further noted that duplicated search keys may maintain the same thread number within the thread number/table number pair stored in pipeline register 219 since all of the requests may originate from the same processor thread via a single write operation.

As stated above, a search key in one of the one or more search key registers 208 may be transferred to CAM 211 through pipeline register 218. The transferred search key may be used to identify a particular entry in data structure memory 206. As stated above, CAM 211 may comprise a plurality of entries where each entry has a particular entry number associated with it. A particular entry number may be used to index into a particular entry in data structure memory 206 as described below. As stated in the Background Information section, a CAM may be accessed by comparing the content of the data stored. Hence, the search key may be used to compare the content of each entry. When there is a match, the entry number associated with the matched entry may be transferred to interface adaptation logic unit 207. It is noted that CAM 211 may be configured in a pipeline manner, e.g., CAM Pipelines 220A–E, thereby enabling an overlap of search keys to be used to identify particular entries in data structure memory 206. CAM Pipelines 220A–E may collectively or individually be referred to as CAM Pipelines 220 or CAM Pipeline 220, respectively. It is further noted that CAM 211 may comprise any number of CAM Pipelines 220 and that FIG. 2 is illustrative.

The particular entry number identified in CAM 211 may be manipulated into one or more possible formats and stored in result register 210 as illustrated in Table 1 below.

| Action | Type Field (2 bits) | Address (26 bits) | Next Bit to Test (8 bits) |
| --- | --- | --- | --- |
| No Matching Entry | 00 | 0000000x | 00000000 |
| Waiting for CAM Result | 00 | Pointer to Result Register | 00000000 |
| CAM Result Points to Data Structure | 01 | Modified by Base Address Register | 00000000 |

Referring to Table 1, a particular entry in result register 210 may be thirty six bits long with the first two bits defining the type field. The type field may be used by interface adaptation logic unit 207 to determine whether the particular entry identified by CAM 211 points to a particular entry in data structure memory 206. The particular CAM entry may then be modified so that the particular entry is in a format used by tree search engine 202 to access a particular entry in data structure memory 206 as described further below. The address field may be the next twenty-six bits which may comprise a pointer to result register 210 in the case where results from CAM 211 may not yet be available or an entry in data structure memory 206 as discussed below. If no matching entry is found in CAM 211, the address field is zero. The next-bit-to-test field may be the following 8 bits which may be zero since tree search engine 202 did not conduct the search of the table, e.g., routing table, quality of service table, filter table, using a Patricia Tree structure to test the appropriate bits to distinguish one entry from another in the case of collisions at a single entry of the hash table.

Referring to Table 1, if the bits of the particular entry number identified were zero (as illustrated in the second row of Table 1), then the particular entry identified in result register 210 did not access a particular entry in CAM 211 associated with the search key. If the first two bits of the particular entry in result register 210 are zero followed by a pointer to an entry in result register 210 (as illustrated in the third row of Table 1), then the result from CAM 211 is not available. When that occurs pending request logic unit 216 may be configured to return the pointer to the selected entry in result register 210 thereby indicating to reader 204 that the result from CAM 211 is not available. This will cause reader 204 to continuously read the same entry in result register 210 until that entry is updated with the requested search results.

If the first two bits of the particular entry identified are 01 (as illustrated in the fourth row of Table 1) then the result may be modified to be in a format used by tree search engine 202 to access a particular entry in data structure memory 206 as described further below. It is noted that the length of the particular entry may be any length and the length of thirty-six bits as illustrated in Table 1 is illustrative. It is further noted that the type field, address field and next bit to test field may be any length and other fields may be defined for additional tree search functioning which may be simulated by interface logic 207.

As stated above, reader 204 may use the type field of the result of CAM 211 to determine whether the particular entry identified by CAM 211 points to a particular entry in data structure memory 206. If CAM 211 indicates that the particular entry identified by the search key points to a particular entry in data structure memory 206, then the result is transferred to result register 210 within interface adaptation logic unit 207. Upon transferring the result to result register 210 the particular entry number may be shifted by shift register 217 and added to a base address provided by a base address register 209 by adder 221. The particular entry number may be shifted by shift register 217 based on the number of bytes in each entry of the table in data structure memory 206 where the particular table may be determined by base address register 209 using the associated thread number/table number pair obtained from thread/table register 215. Upon shifting the particular thread/table number through a pipeline register 219 to maintain proper synchronization between the thread/table number and CAM results, a particular base address provided by base address register 209 my be added to the shifted entry number by adder 221. The base address may be the beginning address of the selected table in data structure memory 206. The result of the shifted entry number added to the base address may be temporarily stored in a particular entry in a result register 210 in interface adaptation logic unit 207. It is noted that the result temporarily stored in result register 210 may be a pointer used to index into the appropriate entry in data structure memory 206 as described further below.

Reader 204 of tree search engine 202 may be configured to read the result temporarily stored in a particular entry in result register 210 by using the address associated with the search key temporarily stored in register 213. A particular entry in result register 210 may be accessed using a particular address associated with the search key as illustrated in Table 2 below.

| Address | Entry |
| --- | --- |
| '100003F0'x | Entry #1 |
| '100003E0'x | Entry #2 |
| ... | ... |
| '100001FC'x | Entry #n |

As stated above, the address may be created by encoding a particular thread number and table number pair associated with the search key. Subsequently, reader 204 may index into the appropriate entry in result register 210 by using the address associated with the search key. It is noted that the format of the result reader 204 retrieves from result register 210 may be in the same format as the pointer identified by the Patricia Tree structure when tree search engine 202 is used to identify the data structure in data structure memory 206 associated with the received packet.

Upon reader 204 reading the result temporarily stored in result register 210, reader 204 may temporarily store the result in register 214. As stated above, data structure reader 205 may be configured to identify a particular entry in data structure memory 206 comprising the data structure associated with the received packet of data. In one embodiment, data structure reader 205 may be configured to index into the appropriate entry by using the result, i.e., pointer, temporarily stored in register 214. Upon data structure reader 205 reading the data structure associated with the received packet of data, processor 201 may be configured to perform particular actions, e.g., modify packet, on the received packet of data.

It is noted that the information temporarily stored in registers 212, 213 and 214 may be stored in fewer than or more than the registers illustrated in FIG. 2. It is further noted that packet processor 103 may comprise more than one processor 201, tree search engine 202, CAM 211, data structure memory 206 and interface adaptation logic unit 207 and that FIG. 2 is illustrative.

FIG. 3—Method for Identifying a Data Structure Associated with a Packet of Data

Figure 3B:
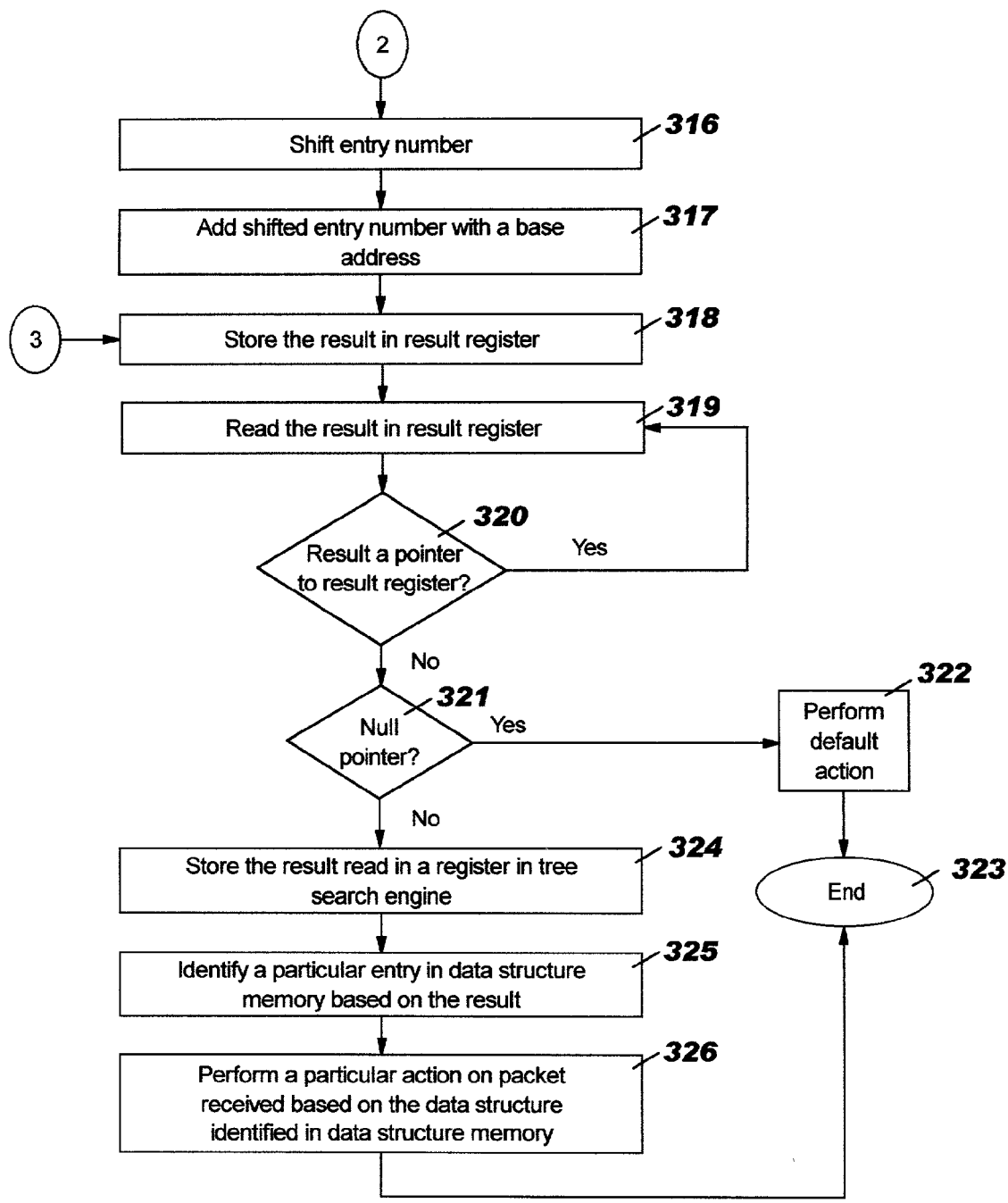

FIGS. 3A–C is a flowchart of one embodiment of the present invention of a method 300 for identifying a data structure associated with a packet of data received by processor 103. As stated in the Background Information section, an advantage of implementing a CAM versus a Patricia Tree structure to search for a particular entry in a hash table is that the search may be conducted faster. However, a CAM is more expensive than implementing the low cost memory storing the Patricia Tree structure. It would therefore be desirable to develop a system that allows some searches to be accomplished by the tree search engine using the lower cost memory storing the Patricia Tree structure and other searches accomplished using the higher cost but faster CAM. Method 300 is a method for allowing some searches to be accomplished by the tree search engine using the lower cost memory storing the Patricia Tree structure and other searches accomplished using the higher cost but faster CAM.

In step 301, packet processor 103 (FIG. 1) may be configured to receive a packet of data from switch fabric 101 (FIG. 1). Referring to FIGS. 2 and 3A, in step 302, processor 201 may be configured to extract one or more fields, e.g., source and destination address, source and destination port, protocol, in the packet header field of the received packet to generate a search key.

In step 303, processor 201 may be configured to select which table, e.g., routing table, quality of service table, filter table, needs to be accessed using the search key in order to process the received packet of data.

A determination may be made by processor 201 as to whether CAM 211 is required to identify the data structure in data structure memory 206 associated with the received packet in step 304. In one embodiment, processor 201 may be configured to read register 212 in tree search engine 202 to determine whether CAM 211 is required to identify the data structure in data structure memory 206. Register 212 may be configured to store definitions associated with various tables, e.g., routing table, quality of service table, filter table. A table definition may comprise information as to whether a CAM 211 may be required to search the table to identify the data structure in data structure memory 206 associated with the received packet. Each particular table, e.g., routing table, in packet processor 103 may comprise a table definition stored in register 212.

If the table definition associated with the table selected in step 303 indicates to search the table using CAM 211, then in step 305, processor 201 may be configured to transfer the search key to a particular address in register 213 of tree search engine 202 along with a directive to tree search engine 202 to search the table selected in step 303 using CAM 211. The address associated with the search key may be created by encoding a particular thread number/table number pair associated with the search key in step 306. As stated above, a thread number may refer to a particular task, e.g., processing a particular packet of data, of processor 201. A table number may refer to a particular table, e.g., routing table, filter table, quality of service table, in processor 103 used to process a packet of data.

In step 307, writer 203 of tree search engine 202 may be configured to transfer the search key to interface adaptation logic unit 207. The search key may be temporarily stored in one or more search key registers 208 in interface adaptation logic unit 207. In step 308, writer 203 of tree search engine 202 may be configured to transfer the address, i.e., the particular thread number/table number pair, associated with the transferred search key to thread/table register 215.

In step 309, the search key in one of the one or more search key registers 208 may be transferred to CAM 211 to index into a particular entry in CAM 211. As stated above, CAM 211 may comprise a plurality of entries where each entry has a particular entry number associated with it. A particular entry number may be used to index into a particular entry in data structure memory 206 as described further below. As stated in the Background Information section, a CAM may be accessed by comparing the content of the data stored. Hence, the search key may be used to compare the content of each entry. When there is a match, the entry number associated with the matched entry may be transferred to interface adaptation logic unit 207 in step 310. It is noted that CAM 211 may be configured in a pipeline manner thereby enabling an overlap of search keys to be used to identify particular entries in data structure memory 206.

A determination may then be made by CAM 211 if the search conducted in CAM 211 is complete in step 311. If the search is not complete, then interface adaptation logic unit 207 may be configured to load result register 210 with a pointer to result register 210 in step 312. Upon loading result register 210 with a pointer to result register 210, interface adaptation logic unit 207 may determines if the search conducted in CAM 211 is complete in step 311.

If the search conducted in CAM 211 is complete, then a determination may be made by CAM 211 if the search key matches a CAM 211 entry in step 313. If there is not a match between the search key and an entry in CAM 211, then CAM 211 returns a result of zero to interface adaptation logic unit 207 in step 314.

If there is a match between the search key and an entry in CAM 211, then CAM 211 returns the entry number of the matching entry in step 315. If the result of CAM 211 points to an entry in data structure memory 206, then the address of the particular entry identified may be modified to be in a format used by tree search engine 202 to access a particular entry in data structure memory 206 as described in steps 316–317 in FIG. 3B. CAM results may be modified with the addition of a type field. For example, the type field, e.g., first two bits in an entry number in result register 210, may indicate that the result points to a particular entry in data structure memory 206 by a particular value, e.g., 01. As illustrated in Table 1, if the bits in the type field are 01 (as illustrated in the fourth row of Table 1) then the result of CAM 211 points to an entry in data structure memory 206. The address of the particular entry identified may then be modified to be in a format used by tree search engine 202 to access a particular entry in data structure memory 206 as described below.

Referring to FIG. 3B in step 316, the entry number transferred to interface adaptation logic unit 207 may be shifted by shift register 217 (FIG. 2). Referring to FIG. 2, the particular entry number may be shifted by shift register 217 based on the number of bytes each table entry to be searched where the particular table may be determined by base address register 209 using the associated thread number/table number pair obtained from thread/table register 215. Returning to FIG. 3B, upon shifting the particular entry number, a particular base address provided by base address register 209 may be added to the shifted entry number by adder 221 in step 317. The base address may be the beginning address of data structure memory 206. The result of the shifted entry number added to the base address and concatenated with the type field may be temporarily stored in a particular entry in result register 210 in interface adaptation logic unit 207 in step 318.

Referring to step 314 in FIG. 3A, the result of zero, i.e., a null pointer, may be temporarily stored in a particular entry in result register 210 in interface adaptation logic unit 207 in step 318.

Returning to FIG. 3B, in step 319, reader 204 of tree search engine 202 may read the result temporarily stored in a particular entry in result register 210 by using the address associated with the search key temporarily stored in register 213. As stated above, the address associated with the search key may be used to decode a particular thread number and table number associated with the search key. Subsequently, reader 204 may index into the appropriate entry in result register 210 by using the thread number and table number of the search key. It is noted that the result reader 204 retrieves may be a pointer used to index into the appropriate entry in data structure memory 205 as described further below.

In step 320, reader 204 of tree search engine 202 may determine whether the result read in step 319 is a pointer to result register 210. If reader 204 retrieves a pointer to result register 210, then reader 204 repeats reading the result in result register 210 in step 319.

If reader 204 does not read a pointer to result register 210, then a determination is made by reader 204 if the result read in step 319 is a null pointer in step 321. If the result read in step 319 by reader 204 is a null pointer then a particular default action may be performed in step 322 depending on the table selected in step 303. For example, if a quality of service table was selected in step 303, then the default action may be to discard the packet received in step 301. Upon performing the default action, method 300 is terminated in step 323.

If the result read in step 319 by reader 204 is not a null pointer, then reader 204 may temporarily store the result read in register 214 in step 324. In step 325, data structure reader 205 may be configured to identify a particular entry in data structure memory 206 comprising the data structure associated with the received packet of data. In one embodiment, data structure reader 205 may be configured to index into the appropriate entry by using the result, i.e., pointer, temporarily stored in register 214. In step 326, upon data structure reader 205 reading the data structure associated with the received packet of data, processor 201 may be configured to perform particular actions, e.g., modify packet, on the received packet of data. Upon performing the particular action, method 300 is terminated in step 323.

Returning to step 304 in FIG. 3A, if processor 201 determines that the data structure associated with the received packet of data may be identified by tree search engine 202 using a standard Patricia Tree structure (not shown) then processor 201 may be configured to hash the search key into a smaller hashed search key used to index into a hash table in step 327 in FIG. 3C. A description of a hash algorithm used to hash the search key into a hashed search key is described in U.S. patent application Ser. No. 09/210,222, filed on Dec. 10, 1998, entitled "Hash Function in IP, MAC, and Other Structured Addresses,".

Referring to FIG. 3C, tree search engine 202 may be configured to read the hashed search key temporarily stored in memory in processor 201 in step 328. In step 329, processor 201 may be configured to issue a directive to tree search engine 202 indicating which table, e.g., filter table, quality of service table, routing table, to search using the hashed search key.

In step 330, reader 204 may be configured to use the hashed search key to index into a table, e.g., hash table. Since a hashed search key may be hundreds of bits long, reader 204 may be configured to use only certain bits to determine which entry to access in the hash table. Consequently, one or more entries may be accessed in the table, e.g., hash table, by the same hashed search key thereby causing a conflict. These conflicts may be resolved by what is commonly referred to as a Practical Algorithm To Retrieve Information Coded in Alphanumeric (Patricia) Tree. A Patricia Tree may test appropriate bits in the hashed search key to distinguish one entry in the hash table from another when multiple entries map to the same hash table entry. Upon testing each of the appropriate bits in the hashed search key, the Patricia Tree structure points to a pointer that may be used to index into the appropriate entry in data structure memory 206. It is noted that the pointer may be in the same format as the result reader 204 retrieves from result register 210 when processor 201 uses CAM 211 to identify the data structure in data structure memory 206 associated with the received packet. It is further noted that the Patricia Tree structure may reside in a memory, SRAM, external to tree search engine 202. The Patricia Tree structure may be connected to tree search engine 202 through interface adaptation logic unit 207. It is further noted that reader 204 may distinguish between accesses to the Patricia Tree structure vs. accesses to result register 210 by appropriate decode of the address presented by reader 204 to Interface Adaptation Logic 207 during read and write operations.

In step 331, upon reader 204 identifying a pointer used to access a particular entry in data structure memory 206 using the Patricia Tree structure, reader 204 may transfer the pointer to data structure reader 205. In step 332, data structure reader 205 may be configured to identify a particular entry in data structure memory 206 comprising the data structure associated with the received packet of data. In one embodiment, data structure reader 205 may be configured to index into the appropriate entry by using the pointer received from reader 204. In step 333, upon data structure reader 205 reading the data structure associated with the received packet of data, processor 201 may be configured to perform particular actions, e.g., modify packet, on the received packet of data. Upon performing the particular action, method 300 is terminated in step 324.

It is noted that method 300 may be executed in a different order presented and that the order presented in the discussion of FIGS. 3A–C are illustrative. It is further noted that certain steps may be executed almost concurrently and may be overlapped with other steps of a different search relating to the processing of a different packet.

Although the system and method are described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

The invention claimed is:

1. A method for identifying a data structure associated with a packet of data comprising the steps of:
   receiving a packet of data;
   extracting one or more fields from a packet header of said packet of data to generate a search key;
   selecting a table to be accessed using said search key;
   determining whether to identify said data structure associated with said packet of data using a content addressable memory or a tree based on a table definition of said selected table; and
   identifying said data structure associated with said packet of data in response to said determination step;
   wherein if said table definition of said selected table determined to use said content addressable memory to identify said data structure then the method further comprises the steps of:
      transferring said search key to a tree search engine; and
      associating said search key with a particular thread number/table number pair.

2. The method as recited in claim 1, wherein said search key is transferred to a particular address in a first register in said tree search engine, wherein said particular address in said first register is used to decode said particular thread number/table number pair associated with said search key.

3. The method as recited in claim 2 further comprising the steps of:
   transferring said search key from said tree search engine to one or more search key registers in an interface unit, wherein said interface unit interfaces said tree search engine and said content addressable memory.

4. The method as recited in claim 3 further comprising the step of:
   transferring said particular address used to decode said particular thread number/table number pair associated with said search key to a second register in said interface unit.

5. The method as recited in claim 4, wherein said one or more search key registers and said second register in said interface unit are organized in a pipeline manner, wherein said search key is associated with one or more thread number/table number pairs.

6. The method as recited in claim 3 further comprising the step of:
   transferring said search key from one of said one or more search key registers to said content addressable memory.

7. The method as recited in claim 6 further comprising the steps of:
   identifying a particular entry number in said content addressable memory based on said search key; and
   identifying said data structure associated with said packet of data in a data structure memory based on said particular entry number in said content addressable memory.

8. The method as recited in claim 6 further comprising the step of:
   determining whether said search key matches a particular entry in said content addressable memory.

9. The method as recited in claim 8, wherein if said search key matches said particular entry in said content addressable memory then said content addressable memory returns a particular entry number.

10. The method as recited in claim 9 further comprising the steps of:
    shifting said particular entry number;
    adding said particular entry number to a base address, wherein said base address comprises a starting address of said data structure memory;
    storing a result of said particular entry number added to said base address in a result register; and
    reading said result in said result register, wherein said result is indexed in said result register based on said particular thread number/table number pair associated with said search key.

11. The method as recited in claim 10, wherein said result is a pointer used to index into an appropriate entry in said data structure memory to identify said data structure associated with said packet of data.

12. The method as recited in claim 10, wherein said result in said result register is a pointer in a same format when said tree is used to identify said data structure associated with said packet of data.

13. A packet processor comprising:
    an internal processor, wherein said internal processor comprises circuitry for:
       receiving a packet of data;
       extracting one or more fields from a packet header of said packet of data to generate a search key;
       selecting a table to be accessed using said search key; and
       determining whether to identify a data structure associated with said packet of data using a content addressable memory or a tree based on a table definition of said selected table;
    a tree search engine coupled to said internal processor;
    a data structure memory coupled to said tree search engine, wherein said data structure memory comprises a plurality of data structures, wherein said data structure of said plurality of data structures comprises data relating to specific actions said internal processor is to perform on said packet of data; and
    said content addressable memory coupled to said tree search engine via an interface unit, wherein said content addressable memory stores a plurality of entries, wherein each of said plurality of entries has an entry number associated with it; and wherein said tree search engine comprises circuitry for:
       identifying said data structure associated with said packet of data in response to said internal processor determining whether to identify said data structure associated with said packet of data using said content addressable memory or said tree based on said table definition of said selected table.

14. The system as recited in claim 13, wherein said internal processor further comprises circuitry for:
    transferring said search key to a tree search engine; and
    associating said search key with a particular thread number/table number pair.

15. The system as recited in claim 14, wherein said search key is transferred to a particular address in a first register in said tree search engine, wherein said particular address in said first register is used to decode said particular thread number/table number pair associated with said search key.

16. The system as recited in claim 15, wherein said tree search engine further comprises circuitry for:
transferring said search key from said tree search engine to one or more search key registers in said interface unit, wherein said interface unit interfaces said tree search engine and said content addressable memory.

17. The system as recited in claim 16, wherein said tree search engine further comprises circuitry for:
transferring said particular address used to decode said particular thread number/table number pair associated with said search key to a second register in said interface unit.

18. The system as recited in claim 17, wherein said one or more search key registers and said second register in said interface unit are organized in a pipeline manner, wherein said search key is associated with one or more thread number/table number pairs.

19. The system as recited in claim 13, wherein said internal processor further comprises circuitry for:
performing a particular action on said packet of data based on said data structure identified in said data structure memory.

20. The system as recited in claim 16, wherein said interface unit comprises circuitry for:
transferring said search key from one of said one or more search key registers to said content addressable memory.

21. The system as recited in claim 20, wherein said content addressable memory comprises circuitry for:
identifying a particular entry number in said content addressable memory based on said search key.

22. The system as recited in claim 21, wherein said tree search engine further comprises circuitry for:
identifying said data structure associated with said packet of data in said data structure memory based on said particular entry number in said content addressable memory.

23. The system as recited in claim 20, wherein said interface unit further comprises circuitry for:
determining whether said search key matches a particular entry in said content addressable memory.

24. The system as recited in claim 23, wherein if said search key matches said particular entry in said content addressable memory then said content addressable memory returns a particular entry number.

25. The system as recited in claim 24, wherein said interface unit further comprises circuitry for:
shifting said particular entry number;
adding said particular entry number to a base address, wherein said base address comprises a starting address of said data structure memory;
storing a result of said particular entry number added to said base address in a result register; and
reading said result in said result register, wherein said result is indexed in said result register based on said particular thread number/table number pair associated with said search key.

26. The system as recited in claim 25, wherein said result is a pointer used to index into an appropriate entry in said data structure memory to identify said data structure associated with said packet of data.

27. The system as recited in claim 25, wherein said result in said result register is a pointer in a same format when said tree is used to identify said data structure associated with said packet of data.

28. A method for identifying a data structure associated with a packet of data comprising the steps of:
receiving a packet of data;
extracting one or more fields from a packet header of said packet of data to generate a search key;
transferring said search key to a content addressable memory by a tree search engine configured to identify said data structure associated with said packet of data;
identifying a particular entry number in said content addressable memory based on said search key; and
identifying said data structure associated with said packet of data based on said particular entry number in said content addressable memory.

29. The method as recited in claim 28, wherein if said search key matches a particular entry in said content addressable memory then said content addressable memory returns said particular entry number.

30. The method as recited in claim 28, wherein if said search key does not matches a particular entry in said content addressable memory then said content addressable memory returns a null pointer.

31. The method as recited in claim 28 further comprising the step of:
performing a search in said content addressable memory using said search key; and
determining whether said search in said content addressable memory is complete.

32. The method as recited in claim 31, wherein if said search in said content addressable memory is not complete then the method further comprises the step of:
loading a register with a pointer, wherein said pointer points to said register.

33. A packet processor comprising:
an internal processor, wherein said internal processor comprises circuitry for:
receiving a packet of data; and
extracting one or more fields from a packet header of said packet of data to generate a search key;
a tree search engine coupled to said internal processor, wherein said tree search engine comprises circuitry for:
transferring said search key to a content addressable memory;
a data structure memory coupled to said tree search engine, wherein said data structure memory comprises a plurality of data structures, wherein a data structure of said plurality of data structures is associated with said packet of data, wherein said data structure comprises data relating to specific actions said internal processor is to perform on said packet of data; and
said content addressable memory coupled to said tree search engine via an interface unit, wherein said content addressable memory stores a plurality of entries, wherein each of said plurality of entries has an entry number associated with it, wherein said content addressable memory comprises circuitry for:
identifying a particular entry number in said content addressable memory based on said search key; and
wherein said tree search engine further comprises circuitry for:

identifying said data structure associated with said packet of data based on said particular entry number in said content addressable memory.

34. The system as recited in claim 33, wherein if said search key matches a particular entry in said content addressable memory then said content addressable memory returns said particular entry number.

35. The system as recited in claim 33, wherein if said search key does not matches a particular entry in said content addressable memory then said content addressable memory returns a null pointer.

36. The system as recited in claim 35, wherein said content addressable memory further comprises circuitry for:

performing a search in said content addressable memory using said search key; and determining whether said search in said content addressable memory is complete.

37. The system as recited in claim 33, wherein if said search in said content addressable memory is not complete then the said interface unit comprises circuitry for:

loading a register with a pointer, wherein said pointer points to said register.

* * * * *